(12) United States Patent
Lo

(10) Patent No.: US 6,370,024 B1
(45) Date of Patent: Apr. 9, 2002

(54) HEAT SINK CLIP

(75) Inventor: Wei-Ta Lo, Miou-Li (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/668,010

(22) Filed: Sep. 21, 2000

(30) Foreign Application Priority Data

Jun. 3, 2000 (TW) ...................................... 89209519 U

(51) Int. Cl.$^7$ ................................................. H05K 7/20
(52) U.S. Cl. ...................... 361/704; 24/458; 165/80.2; 165/185; 174/16.3; 257/719; 361/710; 361/715; 361/690
(58) Field of Search ................... 24/295–296, 457–458, 24/625; 165/80.2, 80.3, 185; 174/16.3; 248/505, 510; 157/704, 707, 718–719, 726–727; 361/704, 690, 707, 709–710, 715, 697; 439/485, 487

(56) References Cited

U.S. PATENT DOCUMENTS

| | | | | |
|---|---|---|---|---|
| 5,396,402 A | * | 3/1995 | Peruginin et al. | ........... 361/704 |
| 5,570,271 A | * | 10/1996 | Lavochkin | .................. 361/704 |
| 6,108,207 A | * | 8/2000 | Lee | .............................. 361/704 |
| 6,181,559 B1 | * | 1/2001 | Soe | .............................. 361/704 |
| 6,205,026 B1 | * | 3/2001 | Wong et al. | ................. 361/704 |
| 6,219,238 B1 | * | 4/2001 | Andros et al. | .............. 361/704 |

* cited by examiner

Primary Examiner—Gregory Thompson
(74) Attorney, Agent, or Firm—Wei Te Chung

(57) ABSTRACT

A heat sink clip (30) includes a spring portion (31) and two arms (36) extending from respective opposite ends of the spring portion. The spring portion has a horizontal portion (35) which forms a tab (33) extending horizontally and then downwardly from a side edge of the horizontal portion. The tab defines a positioning hole (34) for engaging with a catch (62) formed on a side wall of a retention module (60). Each arm defines an aperture (37) for engaging with a beam (61) formed on each end of the retention module. The end of each arm extends outward to form a T-shaped handle (40). The handle includes an L-shaped connecting portion (41) and an L-shaped operation portion (42).

17 Claims, 5 Drawing Sheets

HEAT SINK CLIP

BACKGROUND

1. Field of the Invention

The present invention relates to a clip for attaching a heat sink to an electronic device.

2. The Related Art

During operation of an electronic device in a computer system, a large amount of heat may be produced. Such heat must be quickly removed from the electronic device to prevent the computer system from being damaged or becoming unstable. Consequently, a heat sink is frequently attached to the electronic device to remove heat therefrom, and a clip is used to secure the heat sink to the electronic device.

FIGS. 4 and 5 show a conventional clip 1 for attaching a heat sink 9 to an electronic device 8 mounted on a socket 12. The clip 1 comprises a spring portion 2 and two arms 4 extending from opposite ends of the spring portion 2. Each arm 4 defines an aperture 5 for engaging with a tab (not labeled) formed on the socket 12, and is stamped outwardly to form a handle tab 7. The handle tab 7 is operated on by a tool to detach the clip 1 from the socket 12. However, it is inconvenient to assemble/disassemble a heat sink using a tool, especially within the limited confines inside a computer case. This lowers the efficiency of attaching/detaching the heat sink. Furthermore, while using a tool, an operator can easily skid the tool off the handle tab 7, causing damage to other components in the computer system.

SUMMARY OF THE INVENTION

Accordingly, an object of the present invention is to provide a clip for readily attaching/detaching a heat sink to/from an electronic device.

Another object of the present invention is to provide a clip for securely attaching a heat sink to an electronic device.

To achieve the above-mentioned objects, a heat sink clip comprises a spring portion, and two arms extending from respective opposite ends of the spring portion. The spring portion has a central horizontal portion which forms a tab extending horizontally and then downwardly from one side edge of the horizontal portion. The tab defines a positioning hole therein, for engaging with a catch on a side wall of a retention module. Each arm defines an aperture for engaging with a corresponding beam formed on each end of the retention module. The end of each arm extends outward to form a T-shaped handle. The handle includes an L-shaped connecting portion and an L-shaped operation portion.

Other objects, advantages and novel features of the present invention will be drawn from the following detailed description of a preferred embodiment of the present invention with the attached drawings, in which:

DESCRIPTION OF THE PREFERRED EMBODIMENT

Figure 1:
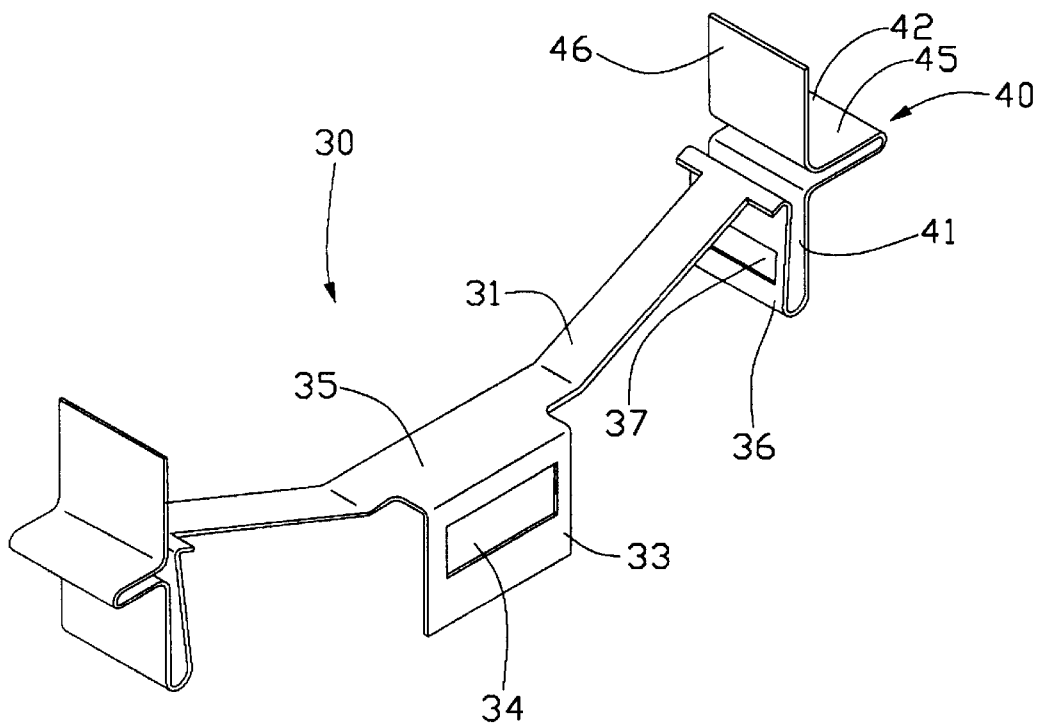
FIG. 1 is a perspective view of a clip of the present invention.

Referring to FIG. 1, a clip 30 of the present invention includes a spring portion 31. The spring portion 31 has a horizontal portion 35 at its center. One side edge of the horizontal portion 35 extends horizontally and then downwardly to form an L-shaped tab 33. The tab 33 defines a positioning hole 34 therein.

A pair of arms 36 depends perpendicularly from respective opposite ends of the spring portion 31. Each arm 36 defines an aperture 37 therein. A distal end of each arm 37 extends outwardly and upwardly to form a T-shaped handle 40. Each handle 40 comprises an L-shaped connecting portion 41 extending from the arm 36 and an L-shaped operation portion 42 extending from an end of the connecting portion 41. The operation portion 42 further comprises a horizontal first portion 45 and a vertical second portion 46.

Figure 2:
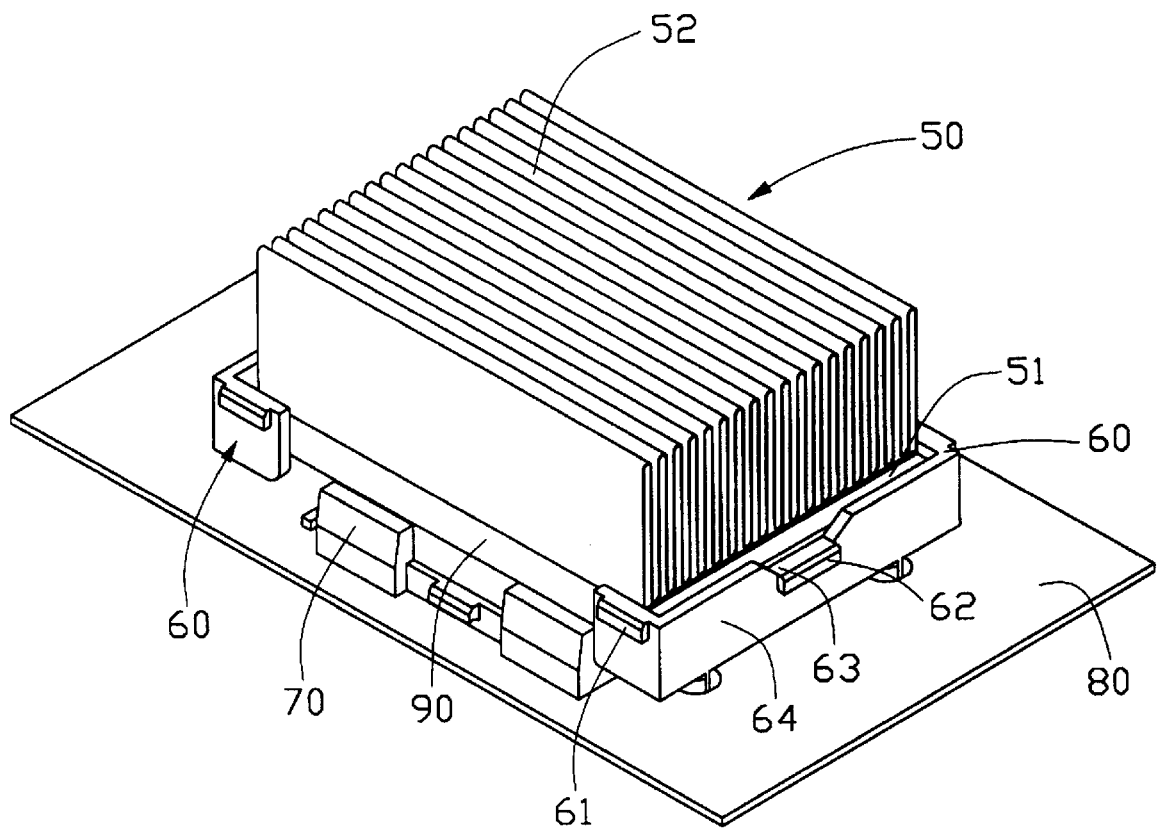
FIG. 2 is a pre-assembled view showing a heat sink positioned on an electronic device between a pair of retention modules.
Figure 3:
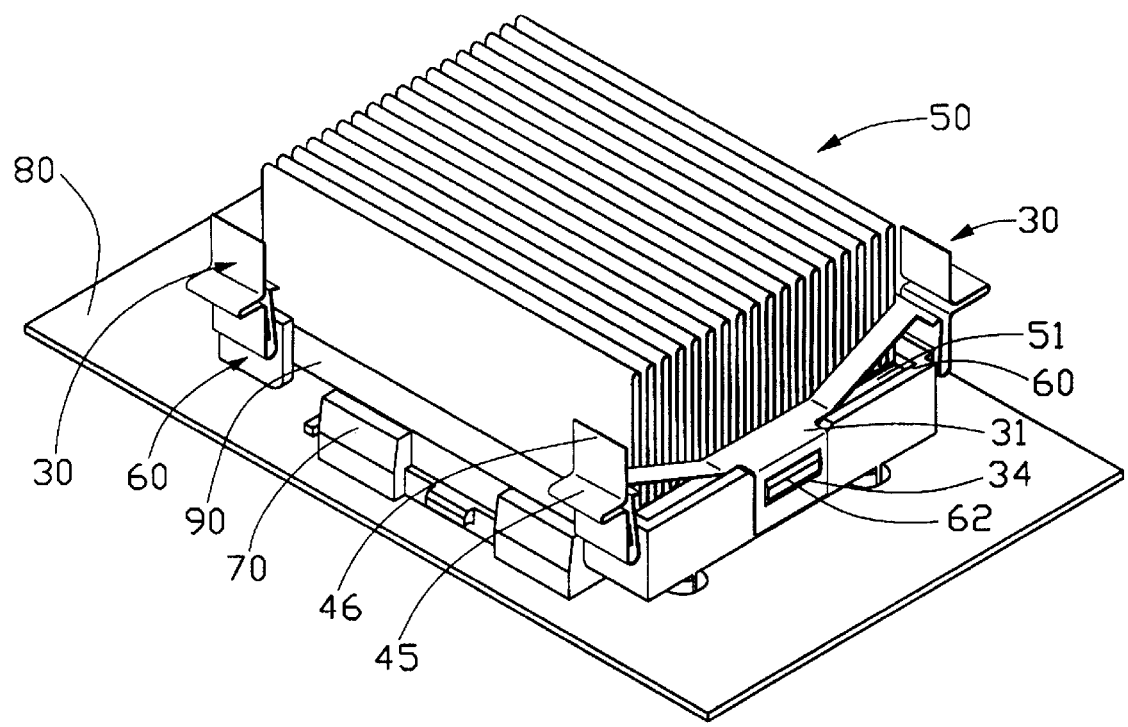
FIG. 3 is an assembled view showing the clip of FIG. 1 attaching -the heat sink to the electronic device.
Figure 4:
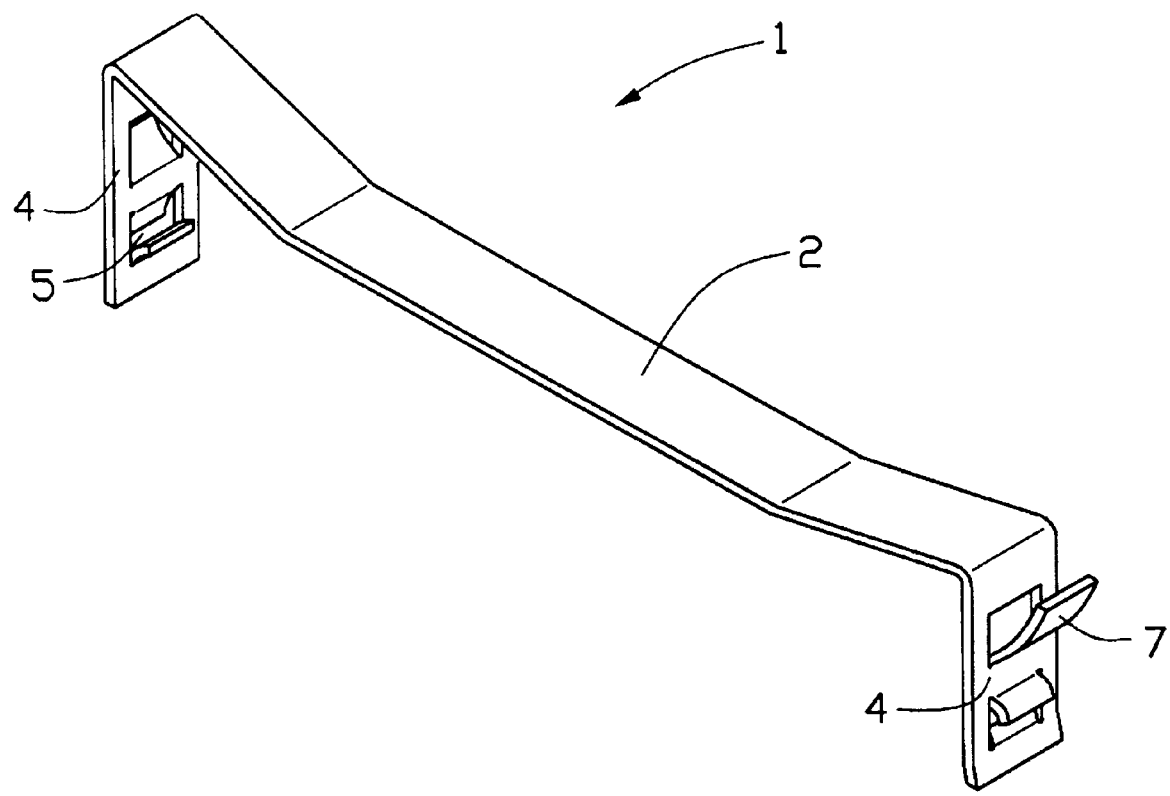
FIG. 4 is a perspective view of a conventional heat sink clip.
Figure 5:
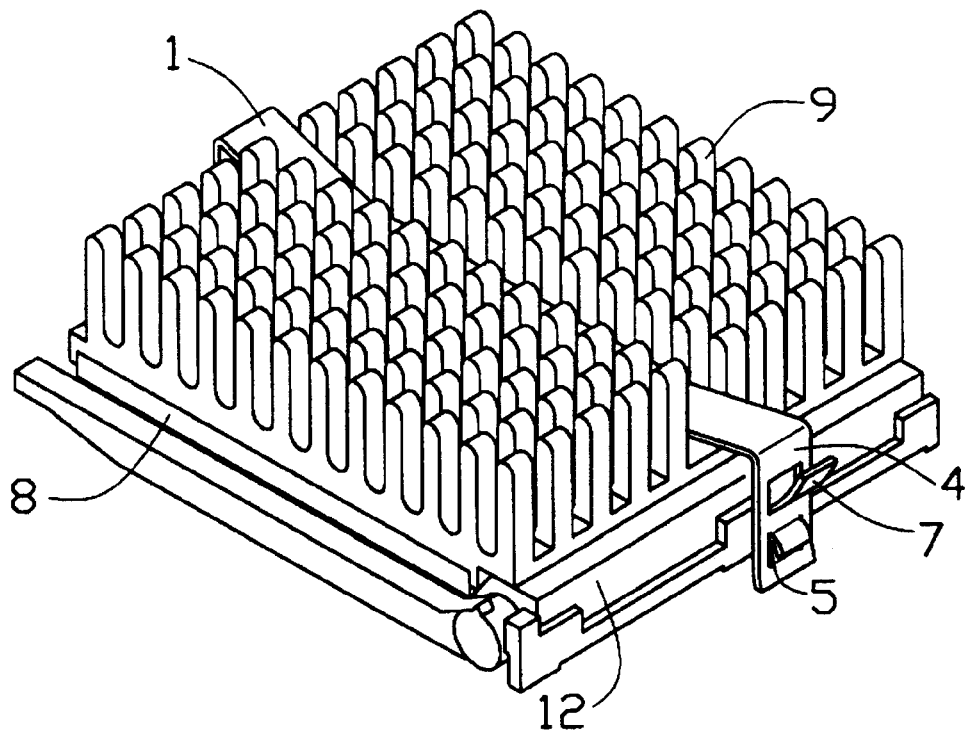
FIG. 5 is an assembled view showing the conventional clip securing a heat sink to an electronic device mounted on a socket.

Referring to FIGS. 2, and 3, in pre-assembly, an electronic device 90 is inserted into a socket connector 70 mounted on a printed circuit board 80. A pair of retention modules 60 is mounted on the printed circuit board 80 at respective opposite sides of the socket connector 70. Each retention module 60 defines a trapeziform cutout 63 at a central top portion of a side wall 64. At the bottom of the trapeziform cutout 63, the side wall 64 extends outward to form a catch 62. The retention module 60 also defines a pair of beams 61 extending from respective opposite ends thereof. A heat sink 50 is placed on the electronic device 90. The heat sink 50 defines a base 51, and a plurality of fins 52 extending upwardly from the base 51. A top surface (not labeled) of the base 51 is slightly lower than a top surface of each retention module 60, but higher than a bottom limit of each trapeziform cutout 63.

In assembly, the clips 30 are attached to the corresponding retention modules 60. The spring portion 31 of each clip 30 is placed onto the top surface of the base 51 of the heat sink 50. Then both first portions 45 of the handles 40 are simultaneously depressed to cause the apertures 37 to engage with corresponding beams 61 of the retention module 60. The positioning hole 34 of each clip 30 engages with the catch 62 of the retention module 60. Thus, the heat sink 50 is securely attached to the electronic device 90 by the clip 30.

In disassembly, the first portions 45 of both handles 40 of each clip 30 are depressed, and the second portions 46 of both handles 40 are pressed inwardly. This releases both apertures 37 of each clip 30 from the beams 61 of each retention module 60. Then the positioning hole 34 of each clip 30 is disengaged from the catch 62 of the socket 60.

It is understood that the invention may be embodied in other forms without departing from the spirit thereof. Thus, the present example and embodiment are to be considered in all respects illustrative and not restrictive, and the invention is not to be limited to the details given herein.

What is claimed is:

1. A heat sink clip comprising:

a spring portion;

a pair of arms extending downward from respective opposite ends of the spring portion; and a pair of handles respectively extending outward and upward from distal ends of the arms;

wherein each handle comprises an L-shaped connecting portion extending from each the arms, and an L-shaped operation portion extending from the connecting portion.

2. The heat sink clip as described in claim 1, wherein the spring portion comprises a horizontal portion and a tab extending downward from one side of the horizontal portion.

3. The heat sink clip as described in claim 2, wherein the tab defines at least a positioning hole adapted to engage at least a catch of a retention module.

4. The heat sink clip as described in claim 1, wherein each handle is generally T-shaped.

5. A heat sink assembly comprising:

a heat sink;

a device positioned under the heat sink and adapted to be secured to a printed circuit board thereunder;

a clip positioned around a first edge of the device and against the heat sink, said clip including a spring portion with a pair of arms downwardly extending from two opposite ends thereof and latchably engaged with opposite first and second sides of the device, respectively, and a tab downwardly extending from a position of the spring portion between said pair of arms and engaged with a third side of the device; wherein a pair of handles respectively extends outwardly and upwardly from the arms.

6. The assembly as described in claim 5, wherein said third side is perpendicular to said first and second sides.

7. The assembly as described in claim 5, wherein said tab is perpendicular to said pair of arms.

8. The assembly as described in claim 5, wherein said heat sink is directly seated upon the device.

9. The assembly as described in claim 5, wherein said third side includes means for locking the tab in position.

10. The assembly as described in claim 5, wherein another clip is positioned around a second edge of the device opposite to the first edge.

11. A heat sink clip for use with a retainer module and a heat sink, comprising:

a spring portion;

a pair of arms downwardly extending from two opposite ends of the spring portion for engaging with the retainer module;

a pair of handles respectively extending outwardly and upwardly from the arms; and a tab downwardly extending from one side of the spring portion between said pair of arms.

12. The heat sink clip as described in claim 11, wherein the spring portion includes a horizontal portion from which the tab extends.

13. The heat sink clip as described in claim 11, wherein both said pair of arms and said tab define locking openings therein for latchable engagement with the retainer module.

14. A heat sink assembly comprising:

a heat sink;

a device positioned under the heat sink and adapted to be secured to a printed circuit board thereunder, said device defining opposite first and second side each with a locking beam thereon;

a clip positioned around a first edge of the device and against the heat sink, said clip including a spring portion with a pair of arms downwardly extending around two opposite ends thereof and latchably engaged with the corresponding locking beams of the device, respectively, and a tab downwardly extending from a position of the spring portion between said pair of arms and engaged with a third side of the device; wherein a pair of handles are respectively positioned beside the corresponding arms, and prevent said corresponding arms and the associated locking beams from being exposed to an exterior in a transverse direction.

15. The assembly as described in claim 14, wherein said arms directly extend from two opposite ends of the spring portion and the handles extend from the corresponding arms, respectively.

16. The assembly as described in claim 14, wherein each of said handles includes an L-shaped connection portion upwardly extending from the corresponding arm.

17. The assembly as described in claim 16, wherein each of said handles further includes an L-shaped operation portion extending from the connection portion, and creates an mirror image with regard to said connection portion.

* * * * *